(12) United States Patent
Fu

(10) Patent No.: US 7,307,311 B2
(45) Date of Patent: Dec. 11, 2007

(54) MOSFET DEVICE

(75) Inventor: Kuan-Yu Fu, Hsinchu (TW)

(73) Assignee: United Microelectronics Corp., Hsinchu (TW)

( * ) Notice: Subject to any disclaimer, the term of this patent is extended or adjusted under 35 U.S.C. 154(b) by 102 days.

(21) Appl. No.: 10/072,362

(22) Filed: Feb. 7, 2002

(65) Prior Publication Data
US 2002/0089019 A1 Jul. 11, 2002

Related U.S. Application Data

(62) Division of application No. 09/382,146, filed on Aug. 24, 1999, now Pat. No. 6,436,798, which is a division of application No. 09/059,548, filed on Apr. 13, 1998, now Pat. No. 6,033,959.

(30) Foreign Application Priority Data
Jan. 9, 1998 (TW) ............... 87100226 A

(51) Int. Cl.
H01L 29/76 (2006.01)
H01L 29/94 (2006.01)
H01L 31/062 (2006.01)
H01L 31/113 (2006.01)

(52) U.S. Cl. .............. 257/330; 257/331; 257/341

(58) Field of Classification Search ........ 257/330–334, 257/341–345; 438/303–306, 270, 289, 574, 438/589
See application file for complete search history.

(56) References Cited

U.S. PATENT DOCUMENTS 4,685,196 A * 8/1987 Lee .............. 438/282
4,835,584 A * 5/1989 Lancaster ............ 257/330
5,029,321 A * 7/1991 Kimura .............. 257/243
5,045,490 A * 9/1991 Esquivel et al. ......... 438/259
5,108,938 A * 4/1992 Solomon ............ 438/212
5,142,640 A * 8/1992 Iwamatsu ............ 257/332
5,972,741 A * 10/1999 Kubo et al. ........... 438/138

* cited by examiner

Primary Examiner—Shouxiang Hu
(74) Attorney, Agent, or Firm—J.C. Patents

(57) ABSTRACT

A method of fabricating a MOSFET device with a multiple T-shaped gate has the following steps. A substrate with an active region and a non-active region is provided, wherein the active region has a plurality of trenches, and the non-active region has a plurality shallow trench isolation structures. A thin insulating layer and a conducting layer are formed in the trenches. The conducting layer is defined to form a gate. The device is implanted with first ions. Then, the device is further implanted with second ions by using a mask, wherein the mask expose the trenches of the active region, and the opening of the mask is wider than the trench. The MOSFET device has at least the following structures. There is a substrate with an active region and a non-active region, wherein the active region has a plurality of trenches and the non-active region has a plurality of shallow trench isolation structures. There is a multiple T-shaped gate with a first part and a second part, wherein the first part is formed between two trenches on the substrate and the second part is formed in the trenches of the active region. There is a source/drain region with a shallow doped region and a deep doped region. The multiple T-shaped gate increases the channel width of the MOSFET device and decreases the short channel effect of the high integrity ICs.

3 Claims, 8 Drawing Sheets

MOSFET DEVICE

CROSS-REFERENCE TO RELATED APPLICATION

This application is a divisional application of, and claims the priority benefit of, U.S. application Ser. No. 09/382,146 filed on Aug. 24, 1999, now U.S. Pat No. 6,436,798 which in term is a divisional application of U.S. patent application Ser. No. 09/059,548, filed on Apr. 13, 1998 now U.S. Pat. No. 6,033,959.

BACKGROUND OF THE INVENTION

1. Field of the Invention

The invention relates in general to a multiple T-shaped gate MOSFET device, and more particularly to a MOSFET device, which can increase the ICs' density and speed without physically scaling down the device's channel length and width, 2. Description of the Related Art In the process of fabricating a MOSFET device, in order to scale down the device, both the channel width and length dimensions are shortened. As the attempt to increase the ULSI device density and speed continues, the technology in the deep sub-micron regime becomes more and more difficult so that it eventually may reach a theoretical limitation. As a result, it is impossible to limitlessly increase the device's density and speed. In addition, the short channel effect will render the technology even more prohibitive. For example, as the channel width and the length dimensions are shortened, punch through of the carriers and the hot carrier effect occur. When the device is even more scaled down, the short channel effect becomes especially significant.

FIGS. 1A to 1H are schematic, cross-sectional views of conventional MOSFET device formation processes. Referring to FIG. 1A, a device includes a substrate 100, a pad oxide layer 102, a silicon nitride layer 104, and a photoresist layer 106. A mask 108 is used to pattern the device. Referring to FIG. 1B, a trench 107 is formed in the substrate 100 by defining the photoresist layer 106, the silicon nitride layer 104, the pad oxide layer 102 and the substrate 100.

The remainder of the photoresist layer 106a and the silicon nitride layer 104a are removed to expose the remainder of the pad oxide layer 102a, as shown in FIG. 1C. Referring to FIG. 1D, a dielectric layer 110 is formed in the trench 107 and over the substrate 100. The dielectric layer 110 is polished to expose the substrate 100 and form a shallow trench isolation (STI) structure 110a as shown in FIG. 1E. Then, a gate oxide layer 112, a metal layer 114, and a photoresist layer 116 are formed on the substrate in turn. Next, a mask 118 is further used to pattern the device.

A gate 114a is formed on the substrate 100 by defining the photoresist layer 116, the metal layer 114, and the gate oxide layer 112 as shown in FIG. 1F. Then, the substrate 100 is implanted with ions to form a shallow doped region 111 in the substrate 100. Referring to FIG. 1G, an oxide layer 120 is deposited on the substrate 100, Then, the oxide layer 120 is etched to form spacers 120a besides the gate 114a by dry etching as shown in FIG. 1H. Then, the substrate 100 is implanted with ions to form a deep doped region 113.

The technology will reach a limit in developing high integrity and operating rate. When the device becomes smaller the short channel effect becomes especially apparent.

The references regarding changing the gate shape to increase the integrity and the operating rate are:

1. F. E. Holmes and C. A. T Salama, Solid State Electron, 17.791 (1974) for V-shape MOS.
2. C. A. T Salama, Solid State Electron, 20.1003 (1977) for U-shape MOS.

SUMMARY OF THE INVENTION

It is therefore an object of the invention to provide an improved resolution to the conventional MOSFET device. Using a multiple T-shaped gate (utilizing the trench technology), device density and speed can be increased without physically scaling down the MOSFET's channel length and width. Once this approach is adopted in the effort to miniature ULSI devices, the short channel effect will be of much less concern.

It is another object of the invention to provide a MOSFET with multiple T-shaped gate, wherein the gate length is increased to improve the operating rate and the integrity.

The invention achieves the above-identified objects by providing a new method of fabricating a MOSFET with a multiple T-shaped gate. The fabricating method includes the following steps. A substrate with an active region and a non-active region is provided. A plurality of trenches are formed in both the active region and the non-active regions in the substrate. An insulating layer is formed in the trenches. The insulating layer in the trenches of the active region is etched. A thin insulating layer is formed in the trenches of the active region and over the surface of the substrate. A conducting layer is formed in the trenches of the active region. The conducting layer is defined to form a gate. The device is implanted with first ions. Then, the device is further implanted with second ions by using a mask, wherein the mask expose the trenches of the active region, and the opening of the mask is wider than the trench.

The MOSFET device includes at least the following structures. A substrate includes an active region and a non-active region, wherein the active region includes a plurality of trenches and the non-active region includes a plurality of shallow trench isolation structures. A thin insulating layer is formed in the trenches of the active region and over the substrate. A multiple T-shaped gate is formed with a first part and a second part, wherein the first part is formed between two trenches on the substrate, and the second part is formed in the trenches of the active region. A source/drain region includes a shallow doped region and a deep doped region, wherein the shallow doped region is in the substrate under the first part, and the deep doped region is in the substrate besides the second part.

BRIEF DESCRIPTION OF THE DRAWINGS

Other objects, features, and advantages of the invention will become apparent from the following detailed description of the preferred but non-limiting embodiments. The description is made with reference to the accompanying drawings in which.

DESCRIPTION OF THE PREFERRED EMBODIMENT

In accordance with the preferred embodiment of the present invention, a multiple T-shaped gate MOSFET device is provided to increase the operating rate of the ICs and to lower the short channel effect in high integrity ICs. FIG. 2A to 2G are cross-sectional views showing the process steps of one preferred embodiment for fabricating a two T-shaped gate MOSFET device.

Figure 1A:
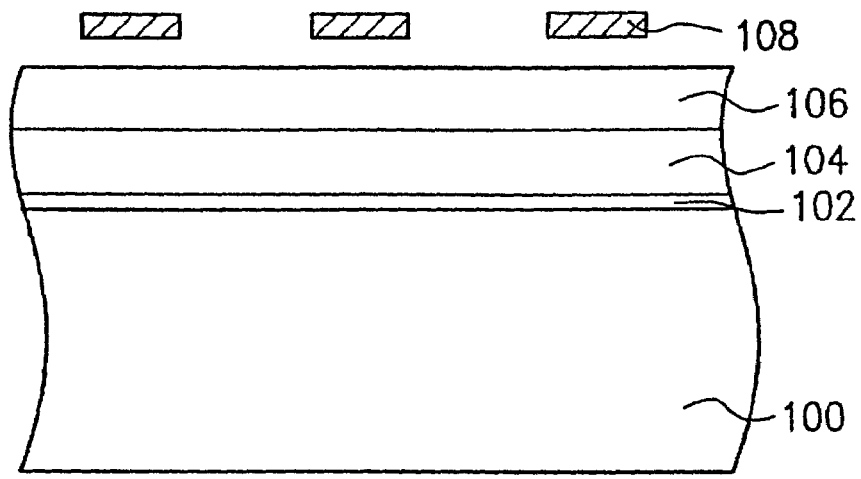
FIGS. 1A to 1H (Prior Art) are cross-sectional views showing a conventional process of forming a gate.
Figure 1B:
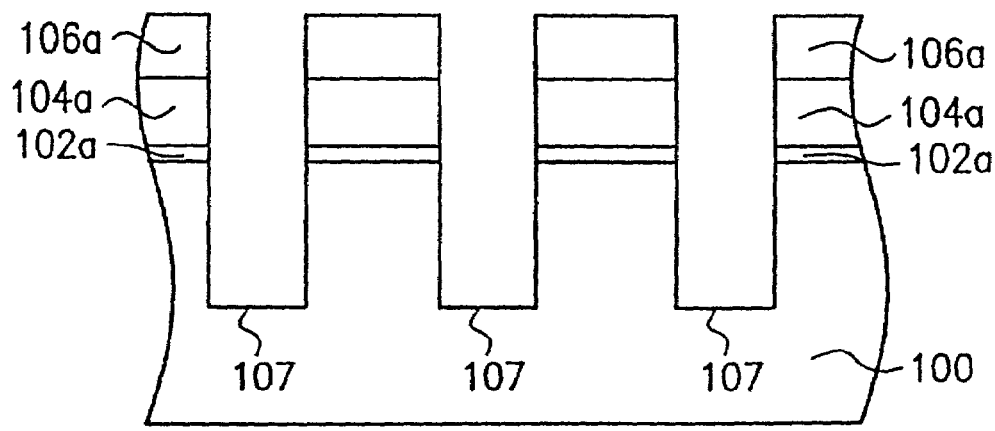
Figure 1C:
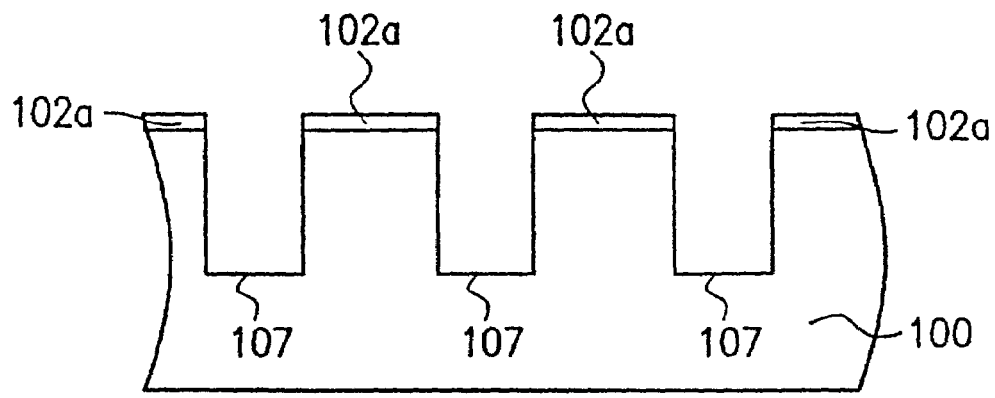
Figure 1D:
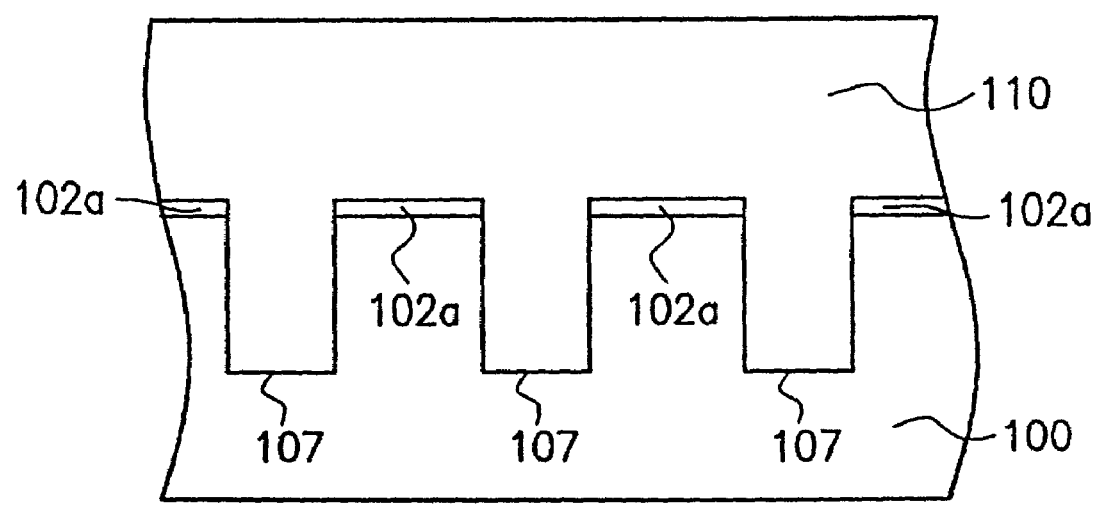
Figure 1E:
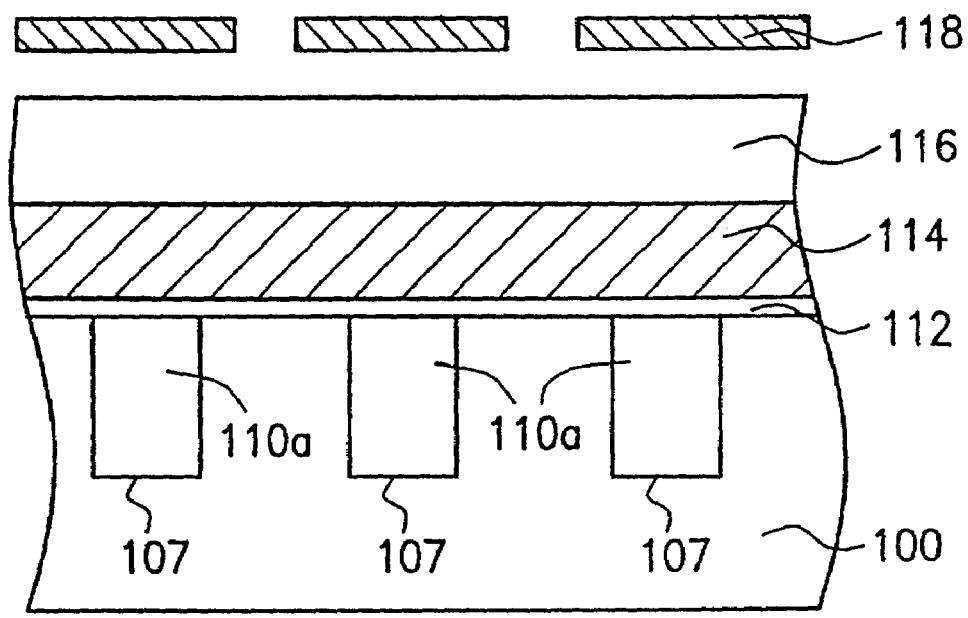
Figure 1F:
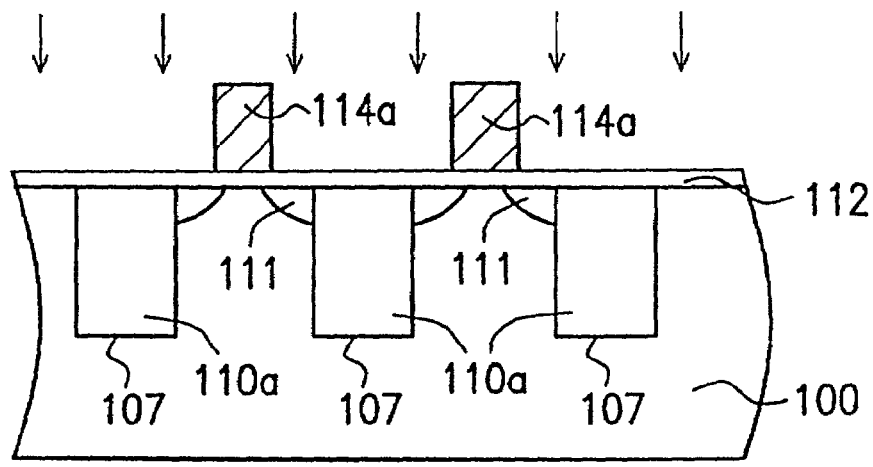
Figure 1G:
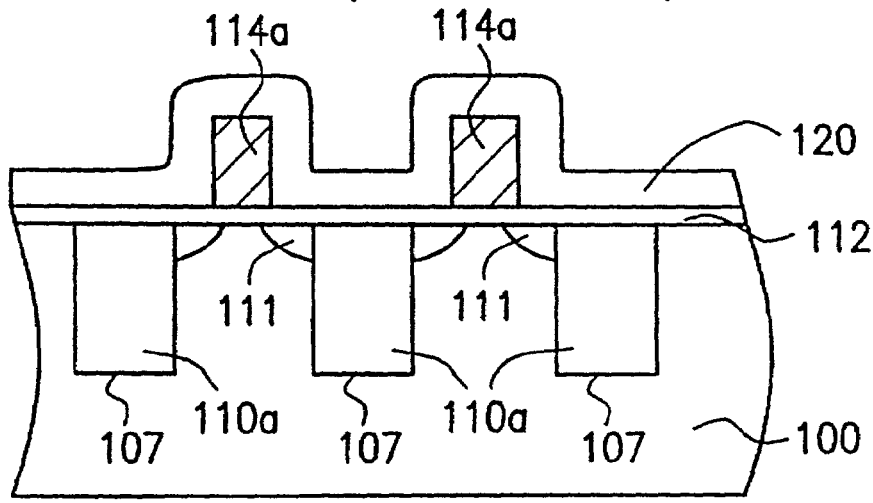
Figure 1H:
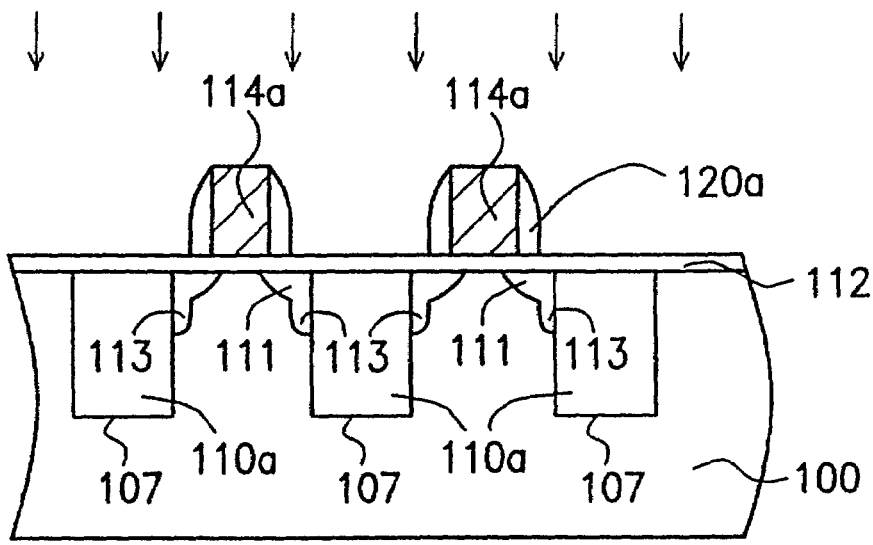
Figure 2A:
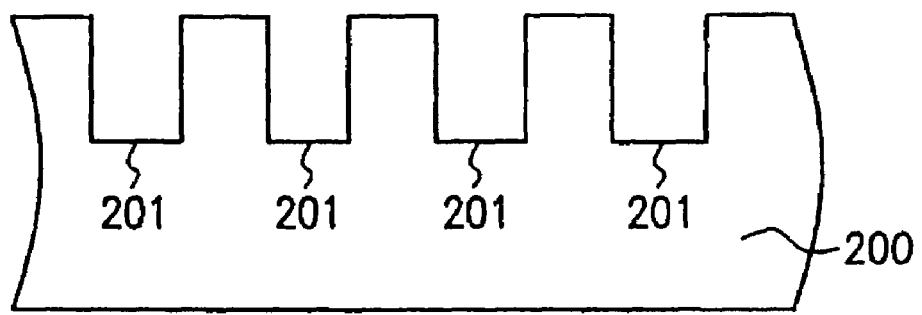
FIGS. 2A to 2G are cross-sectional views showing the process steps of the method for fabricating a multiple T-shaped gate MOSFET device in accordance with a preferred embodiment of the present invention.
Figure 2B:
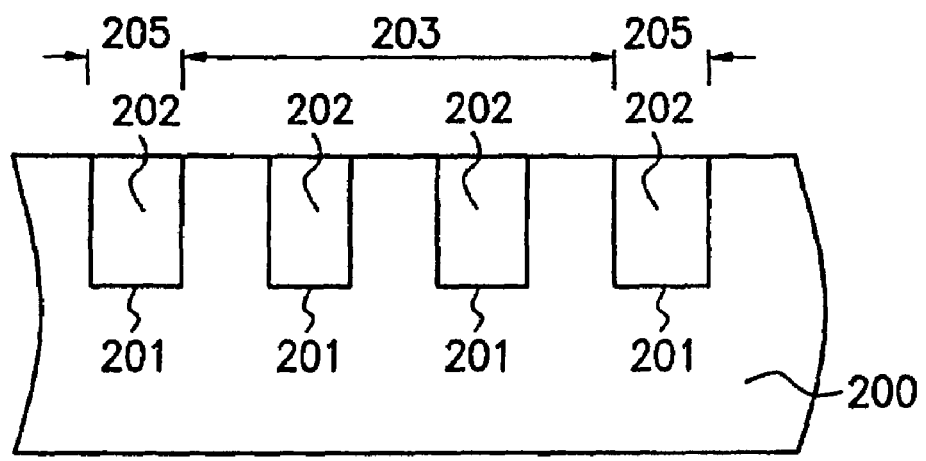

Referring first to FIG. 2A, a substrate 200 is provided, wherein a number of trenches 201 are formed in the substrate 200. A dielectric layer is formed in the trenches 201 and over the substrate 200 by chemical vapor deposition (CVD). Then, the dielectric layer is polished to expose the surface of the substrate 200 and form several shallow trench isolation (STI) structures 202 as shown in FIG. 2B. The device includes an active region 203 and a non-active region 205.

Figure 2C:
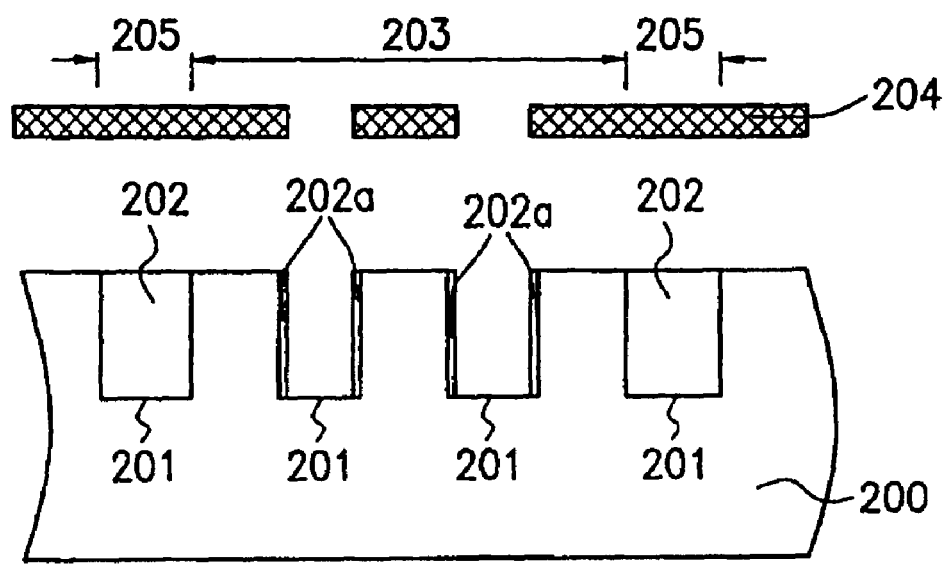

Referring to FIG. 2C, a mask 204 is used to pattern the STI structures 202 of the active region 203. The STI structures 202 of the active region 203 are etched to expose the trenches 201 and leave the remainder of the dielectric layer 202a on the sides of the trenches 201. The STI structures 202 are used to isolate the MOSFET device.

Figure 2D:
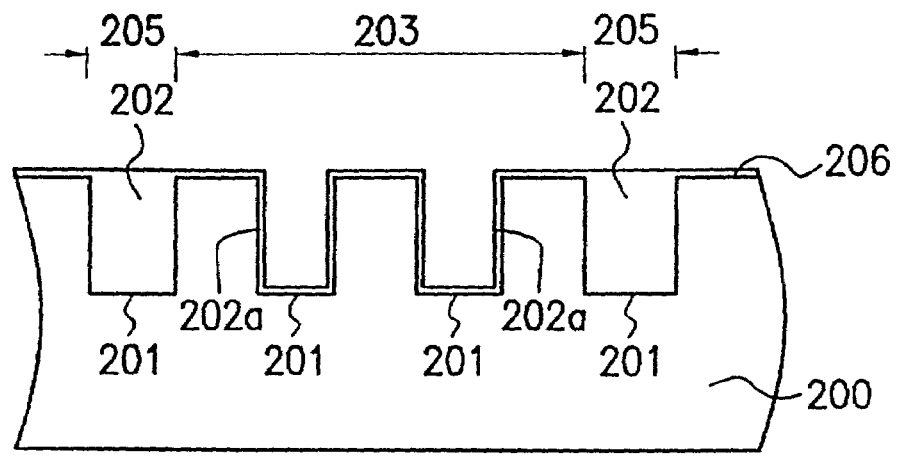
Figure 2E:
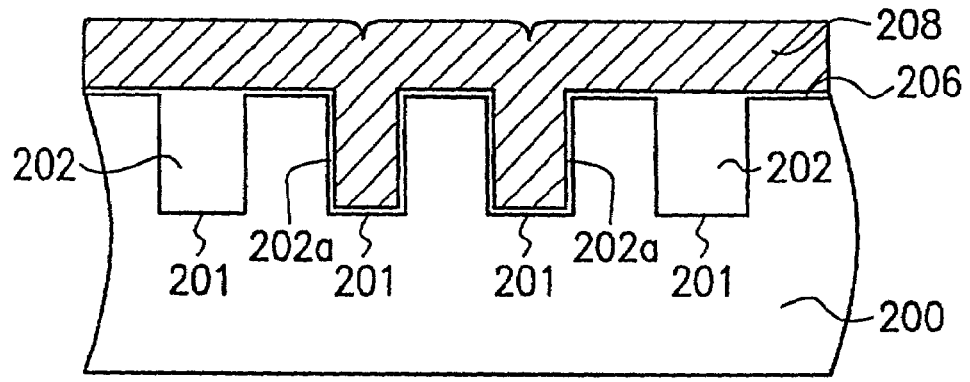

Referring to FIG. 2D, a thin dielectric layer is formed in the trenches 201 and over the substrate 200. The thin dielectric layer formed in the trenches 201 is a side-wall oxide layer 202a and over the substrate 200 is a gate oxide layer 206. The thickness of the side-wall oxide layer 202a is about 0.1 µm. The side-wall oxide layer 202a is used to protect the device from generating parasitic capacitance. Then, a conducting layer 208 is formed on the device by CVD as shown in FIG. 2E.

Figure 2F:
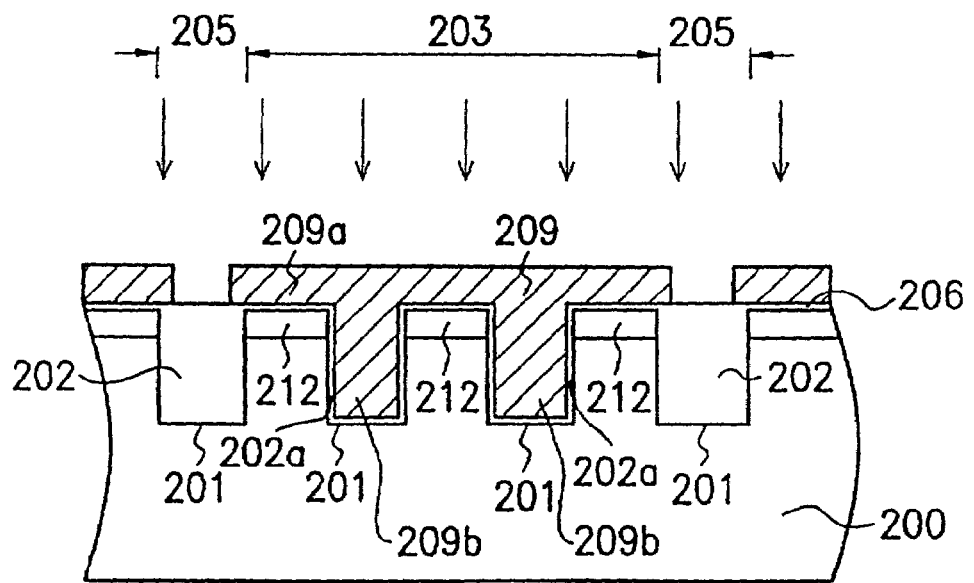

Referring to FIG. 2F, the conducting layer 208 is patterned to form a gate 209. The gate 209 includes a first gate part 209a and a second gate part 209b, wherein the first gate part 209a lies on the substrate 200 between the trenches 201 and the second gate part 209b is in the trenches 201 of the active region 203. Then, the device is implanted to form a number of shallow doped regions 212 in the substrate 200 of the active region 203.

Figure 2G:
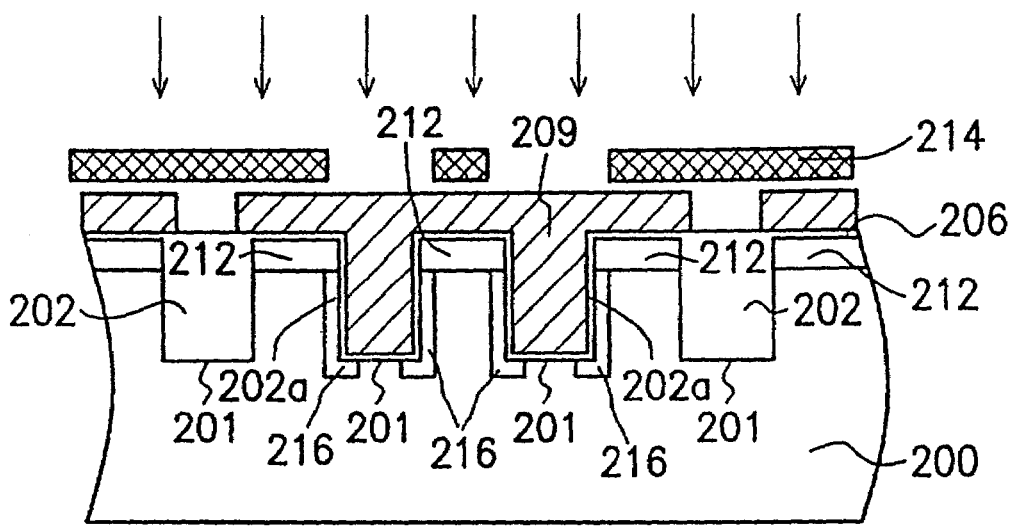

Referring to FIG. 2G, the device is further implanted to form a number of deep doped regions 216 by using a mask 214, wherein the mask 214 is used to expose the trenches 201 of the active region 203. The opening of the mask 214 is wider than the trench 201.

Figure 3A:
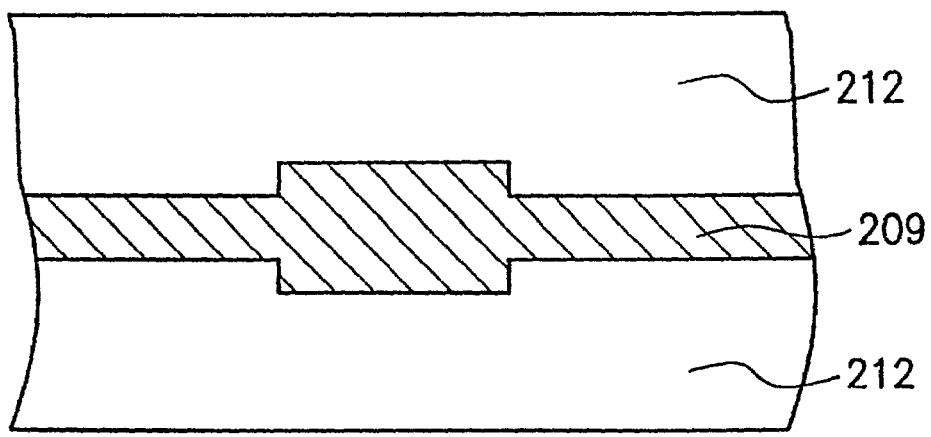
FIGS. 3A to 3B are the top views of the MOSFET device as shown in FIGS. 2F and 2G.
Figure 3B:
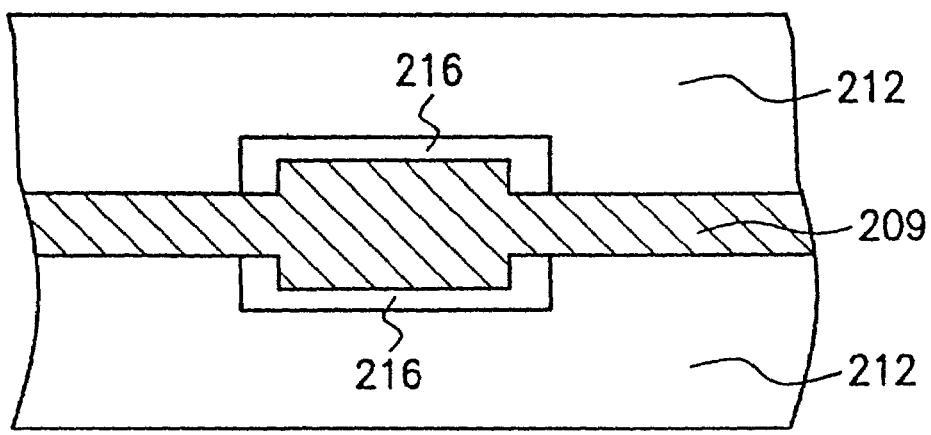

FIG. 3A is the top view of the MOSFET device as shown in FIG. 2F and FIG. 3B is the top view of the MOSFET device as shown in FIG. 2G. FIG. 3A includes the shallow doped region 212 and the gate 209. FIG. 3B includes the deep doped region 216, the shallow doped region 212 and the gate 209.

Figure 4A:
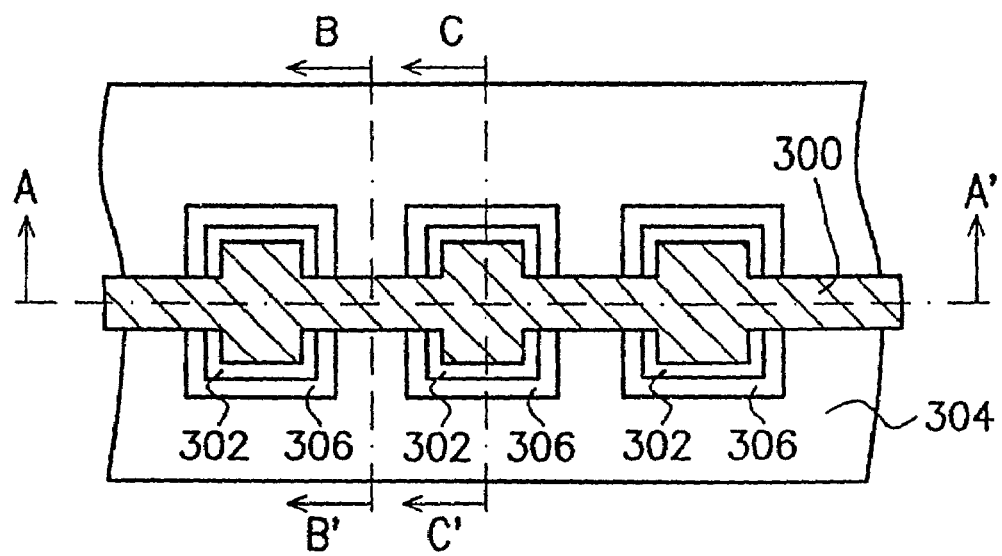
FIGS. 4A to 4D are cross-sectional views of a multiple T-shaped gate MOSFET device in accordance with the preferred embodiment.

FIGS. 4A to 4D show a three T-shaped gate MOSFET device in accordance with the preferred embodiment. FIG. 4A shows a top view of the three T-shaped gate MOSFET device. In FIG. 4A, the device includes a gate 300, a shallow doped region 304, a deep doped region 306, and an oxide layer 302.

Figure 4B:
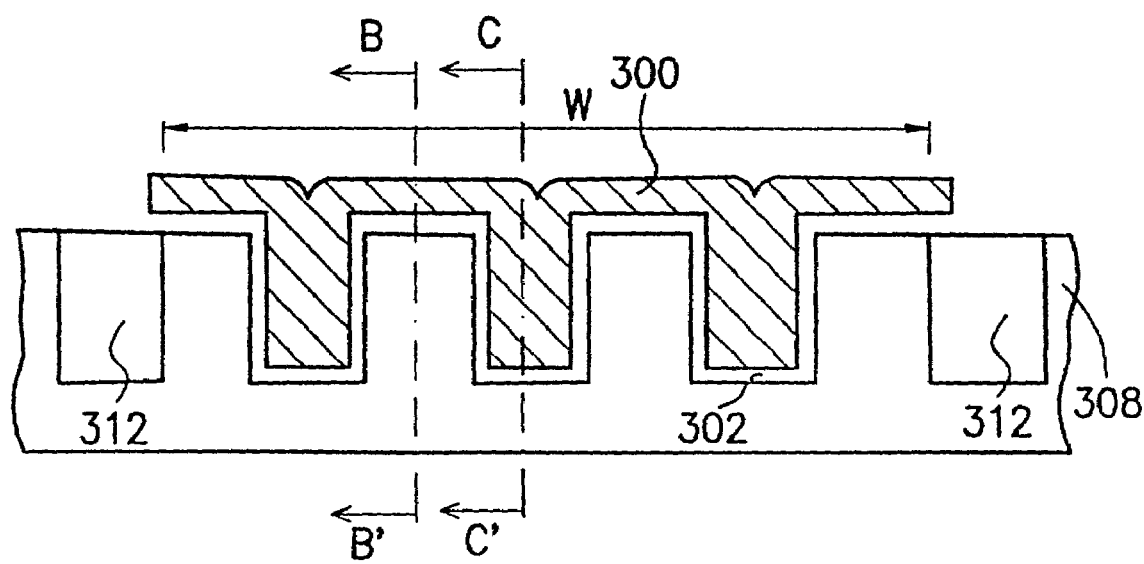

FIG. 4B shows the cross-sectional view taken along the line AA' of the FIG. 4A. As FIG. 4B shows, the device includes a substrate 308, the gate 300, the oxide layer 302 and STI structures 312. W denotes the channel width of the device.

Figure 4C:
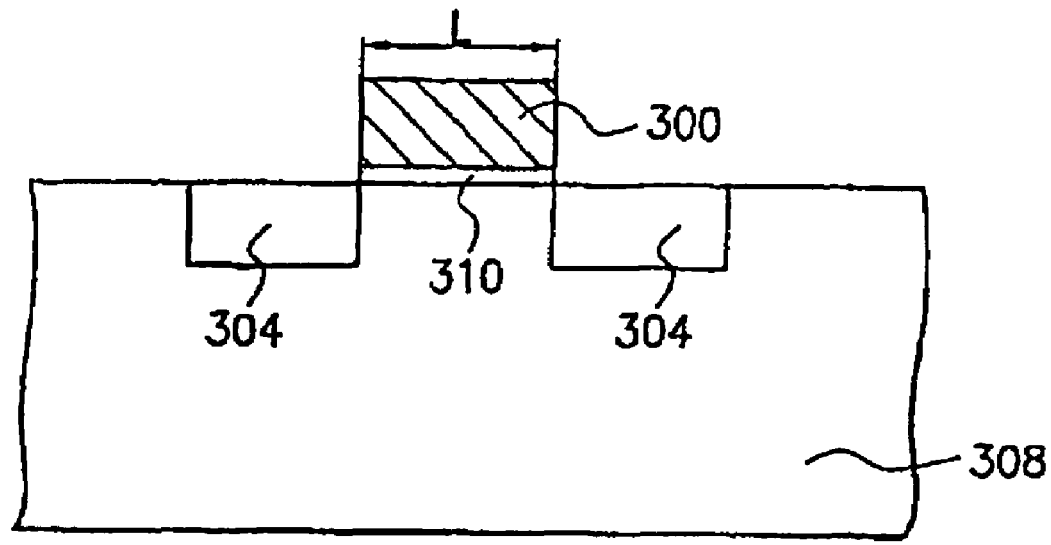

FIG. 4C shows the cross-sectional view taken along the line BB' of the FIGS. 4A and 4B. As FIG. 4C shows, the device includes the substrate 308, the gate 300, the shallow doped region 304, and a gate oxide layer 310 under the gate 300, wherein L denotes the channel length of the device.

Figure 4D:
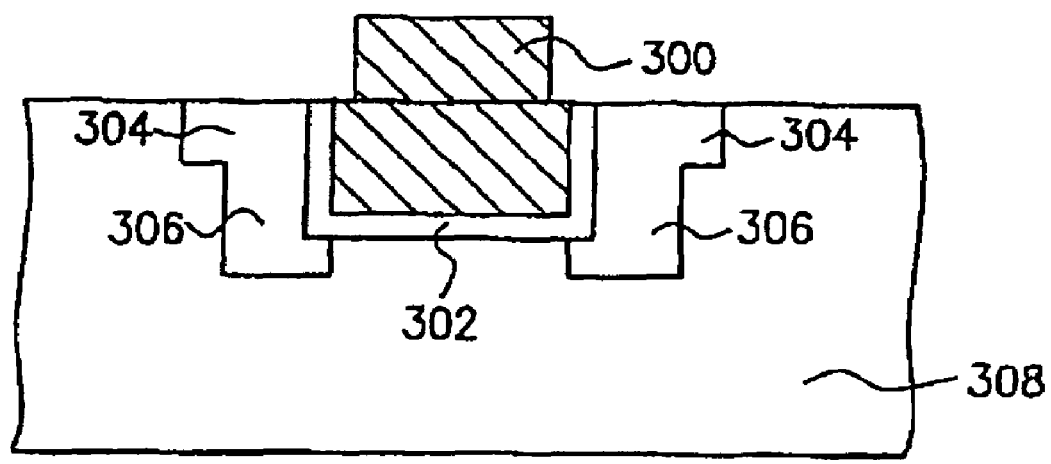

FIG. 4D shows the cross-sectional view taken along the line CC' of the FIGS. 4A and 4B. As FIG. 4D shows, the device includes the substrate 308, the gate 300, the shallow doped region 304, and the deep doped region 306. For the device, the shallow doped region 304 and the deep doped region 306 form the source/drain regions.

The preferred embodiment discloses a multiple T-shaped gate MOSFET device. The device has "gate legs" dipped into the trenches in the substrate. Between the "gate legs" in the trenches and the source/drain junctions, a thicker dielectric layer (>0.1 µm) is formed to reduce parasitic capacitance. Around the dielectric layer (~0.1 µm in the horizontal dimension), the source/drain junctions are doped to a depth as deep as the trench to create the transistor action under the bottom as well as at the side walls of the trench. With this special structure, the transistor's width is effectively increased by 2nt, wherein n is the number of trenches and t is the trench depth. This requires 2 extra masks in the process: one for the dielectric etch in the trenches (mask 204 in FIG. 2C) and another for the deep source/drain junction implant (mask 214 in FIG. 2G). The value of the advantages gained by this invention should exceed the price of the extra mask(s). The effective width of the transistor is increased by 2nt, while the real surface dimension can be reduced. For example, if both the trench width and space are 0.5 µm and t is 1 µm, the reduction in the linear dimension of ULSI circuits will be 50%. With this approach, instead of continuing the scaled-down of both W and L in MOSFET, one can increase n and t to achieve the same purpose, i.e., to increase density and speed. The short channel effect will be of much less concern in this approach.

While the invention has been described by way of example and in terms of a preferred embodiment, it is to be understood that the invention is not limited thereto. To the contrary, it is intended to cover various modifications and similar arrangements and procedures, and the scope of the appended claims therefore should be accorded the broadest interpretation so as to encompass all such modifications and similar arrangements and procedures.

What is claimed is:

1. A semiconductor structure comprising a substrate having an active region of a first conductive type including a channel region and a non-channel region surrounding the channel region, at least a first trench and a second trench disposed in the active region, the structure comprising:

a thin insulating layer disposed over said first and second trenches partially filling said first and second trenches and being conformal to said first and second trenches;

a gate electrode comprising a first conductive vertical portion, a second conductive vertical portion and a horizontal conductive portion, wherein the conductive first vertical portion is embedded inside the first trench over said thin insulating layer such that said insulating layer and said first conductive vertical portion within the first trench completely fills the first trench, the second conductive vertical portion is embedded inside the second trench over said thin insulating layer such that said insulating layer and said second conductive vertical portion within the second trench completely fills the second trench, and the horizontal conductive portion is disposed over the substrate and connects said first and second conductive vertical portions together; and a pair of shallow doped regions within the substrate disposed adjacent to and on two opposite sides of each of the first and second conductive vertical portions and the conductive horizontal portion; and a pair of deep doped regions extending respectively from the first pair of shallow doped regions to regions within the substrate deeper than the first and second trenches, wherein the pair of shallow doped regions form shallow source/drain regions with a shallow channel region therebetween below the conductive horizontal portion; and, wherein the pair of deep doped regions form deep source/drain regions with two deep channel regions therebetween below the first and second trenches, respectively.

2. The structure according to claim 1, wherein the thin insulating layer is formed by thermal oxidation.

3. The structure according to claim 1, wherein a thickness of the thin insulating layer is about 0.1 μm.

* * * * *